US012577659B2

(12) United States Patent
Zhu et al.

(10) Patent No.: US 12,577,659 B2
(45) Date of Patent: Mar. 17, 2026

(54) METHODS AND ASSEMBLIES FOR SELECTIVELY DEPOSITING MOLYBDENUM

(71) Applicant: ASM IP Holding B.V., Almere (NL)

(72) Inventors: Chiyu Zhu, Helsinki (FI); Sukanya Datta, Phoenix, AZ (US); Jan Willem Maes, Wilrijk (BE)

(73) Assignee: ASM IP Holding B.V., Almere (NL)

( * ) Notice: Subject to any disclaimer, the term of this patent is extended or adjusted under 35 U.S.C. 154(b) by 28 days.

(21) Appl. No.: 18/396,835

(22) Filed: Dec. 27, 2023

(65) Prior Publication Data

US 2024/0218501 A1 Jul. 4, 2024

Related U.S. Application Data

(60) Provisional application No. 63/436,122, filed on Dec. 30, 2022.

(51) Int. Cl.
*C23C 16/08* (2006.01)
*C23C 16/04* (2006.01)

(52) U.S. Cl.
CPC .............. *C23C 16/08* (2013.01); *C23C 16/04* (2013.01)

(58) Field of Classification Search
None
See application file for complete search history.

(56) References Cited

U.S. PATENT DOCUMENTS

| | | | | |
|---|---|---|---|---|
| 2018/0127873 A1* | 5/2018 | Sarnet | .................... | C23C 16/16 |
| 2019/0067016 A1 | 2/2019 | Zhu | | |
| 2021/0233772 A1* | 7/2021 | Zhu | .................. | H01L 21/28568 |
| 2021/0407809 A1 | 12/2021 | Zope | | |

* cited by examiner

*Primary Examiner* — Shamim Ahmed
*Assistant Examiner* — Bradford M Gates
(74) *Attorney, Agent, or Firm* — Laine IP Oy; Mark W. Scott

(57) ABSTRACT

The disclosure relates to methods of selectively depositing material comprising molybdenum on a first surface of a substrate relative to a second surface of the substrate by a cyclic deposition process. The methods comprise providing a substrate in a reaction chamber, and performing at least one super-cycle comprising a halide sub-cycle and an oxy-halide sub-cycle. The halide sub-cycle comprises providing molybdenum halide precursor into the reaction chamber in a vapor phase, and the oxyhalide sub-cycle comprises providing molybdenum oxyhalide precursor into the reaction chamber in a vapor phase and providing a reactant into the reaction chamber to deposit material comprising molybdenum on the first surface of the substrate. The disclosure further relates to molybdenum layer, to a semiconductor structure and a device, and to vapor deposition assemblies for selectively depositing material comprising molybdenum on a substrate.

20 Claims, 2 Drawing Sheets

METHODS AND ASSEMBLIES FOR SELECTIVELY DEPOSITING MOLYBDENUM

CROSS-REFERENCE TO RELATED APPLICATIONS

This application claims priority to and the benefit of U.S. Provisional Application No. 63/436,122, filed Dec. 30, 2022, the entirety of which is incorporated by reference herein.

FIELD

The present disclosure relates to methods and apparatuses for the manufacture of semiconductor devices. More particularly, the disclosure relates to methods and assemblies for selectively depositing material comprising molybdenum, layers comprising molybdenum, as well as semiconductor structures and devices.

BACKGROUND

Semiconductor device fabrication processes generally use advanced deposition methods for forming metal-comprising layers with specific properties. Molybdenum may be useful for a range of semiconductor applications, and may have many of the advantages sought in the art. For example, it may be useful as a conductor material in back end of line (BEOL) or mid end of line (MEOL) applications, or in in metal gate applications.

The selective deposition of metallic thin films by atomic layer deposition remains challenging, especially to deposit high-quality films containing electropositive elements and metals that readily form unwanted phases, such as carbides. Further, area-selective deposition of molybdenum is sought after to enable more elaborate fabrication of semiconductor devices, while keeping the number of processing steps feasible and/or cost-effective. Thus there is need in the art for alternative or improved methods for depositing material comprising molybdenum selectively.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing a material comprising molybdenum on a substrate selectively, to molybdenum layers, to a semiconductor structure and a device, and to deposition assemblies for selectively depositing material comprising molybdenum on a substrate.

In an aspect, a method of selectively depositing material comprising molybdenum on a first surface of a substrate relative to a second surface of the substrate by a cyclic deposition process is disclosed. The method comprises providing a substrate in a reaction chamber, and performing at least one super-cycle comprising a halide sub-cycle and an oxyhalide sub-cycle. The halide sub-cycle comprises providing molybdenum halide precursor into the reaction chamber in a vapor phase, and the oxyhalide sub-cycle comprises providing molybdenum oxyhalide precursor into the reaction chamber in a vapor phase and providing a reactant into the reaction chamber to deposit material comprising molybdenum on the first surface of the substrate.

In some embodiments, the halogen in the molybdenum halide and molybdenum oxyhalide precursor is selected from a group consisting of chlorine, fluorine, bromine and iodine. In some embodiments, the halogen in the molybdenum oxyhalide precursor and the molybdenum halide precursor is chlorine. In some embodiments, the molybdenum oxyhalide is selected from a group consisting of $MoO_2Cl_2$ and $MoClO_4$. In some embodiments, the molybdenum halide precursor is $MoCl_5$.

In some embodiments, the reactant is a reducing agent. In some embodiments, the reducing agent is selected from a group consisting of molecular hydrogen, hydrazine and derivatives of hydrazine. In some embodiments, the reducing agent is molecular hydrogen ($H_2$).

In some embodiments, the halide sub-cycle comprises providing a reactant into the reaction chamber in a vapor phase. In some embodiments, the molybdenum halide precursor and the reactant are provided into the reaction chamber alternately and sequentially.

In some embodiments, the molybdenum oxyhalide precursor and the reactant are provided into the reaction chamber alternately and sequentially.

In some embodiments, the ratio of halide sub-cycles to oxyhalide sub-cycles in at least one super-cycle is from 1:1 to 1:50. In some embodiments, at least one super-cycle comprises from 1 to 50 oxyhalide sub-cycles. In some embodiments, the super-cycle is performed from 2 to about 1,500 times.

In some embodiments, the first surface is a metal or metallic surface. In some embodiments, the metal or metallic surface is selected from a group consisting of elemental molybdenum (Mo) surface, elemental tungsten (W) surface, elemental ruthenium (Ru) surface, elemental copper (Cu) surface, elemental cobalt (Co) surface, vanadium nitride (VN) surface, titanium carbide (TiC) surface and titanium nitride (TiN) surface.

In some embodiments, the second surface is a dielectric surface. In some embodiments, the dielectric surface comprises silicon. In some embodiments, the second surface is a metal oxide surface.

In another aspect, a semiconductor structure comprising a molybdenum layer deposited by a method according to the current disclosure.

In a further aspect, a semiconductor device comprising a molybdenum layer deposited by a method according to the current disclosure.

In a yet another aspect, vapor deposition assembly for selectively depositing material comprising molybdenum on a first surface of a substrate relative to a second surface of the substrate is disclosed. The vapor deposition assembly comprises one or more reaction chambers constructed and arranged to hold the substrate, a first precursor source constructed and arranged to contain and evaporate molybdenum halide precursor, a second precursor source constructed and arranged to contain and evaporate molybdenum oxyhalide precursor and a reactant source constructed an arranged to contain and evaporate a reactant. The vapor deposition assembly is constructed and arranged to provide molybdenum halide precursor, molybdenum oxyhalide precursor and a reactant into the reaction chamber in a vapor phase; wherein the molybdenum halide precursor consists of molybdenum and halogen, and the molybdenum oxyhalide precursor consists of molybdenum, halogen and oxygen. The vapor deposition assembly is constructed and arranged to provide the molybdenum halide precursor, the molybdenum oxyhalide precursor and the reactant via the precursor injector system to the reaction chamber to deposit material comprising molybdenum selectively on the first surface of the substrate relative to the second surface of the substrate.

In some embodiments, the vapor deposition assembly comprises a controller programmed to cause the assembly to carry out a method according to the current disclosure.

In some embodiments, the cyclic deposition process comprises a thermal deposition process. In some embodiments, the cyclic deposition process comprises purging the reaction chamber after providing a molybdenum precursor into the reaction chamber. In some embodiments, molybdenum is deposited on the first surface of the substrate as a layer.

In some embodiments, the molybdenum layer has a carbon content of less than about 20 at-%.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments. The headings provided herein, if any, are for convenience only and do not necessarily affect the scope or meaning of the claimed invention.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings

Figure 1:
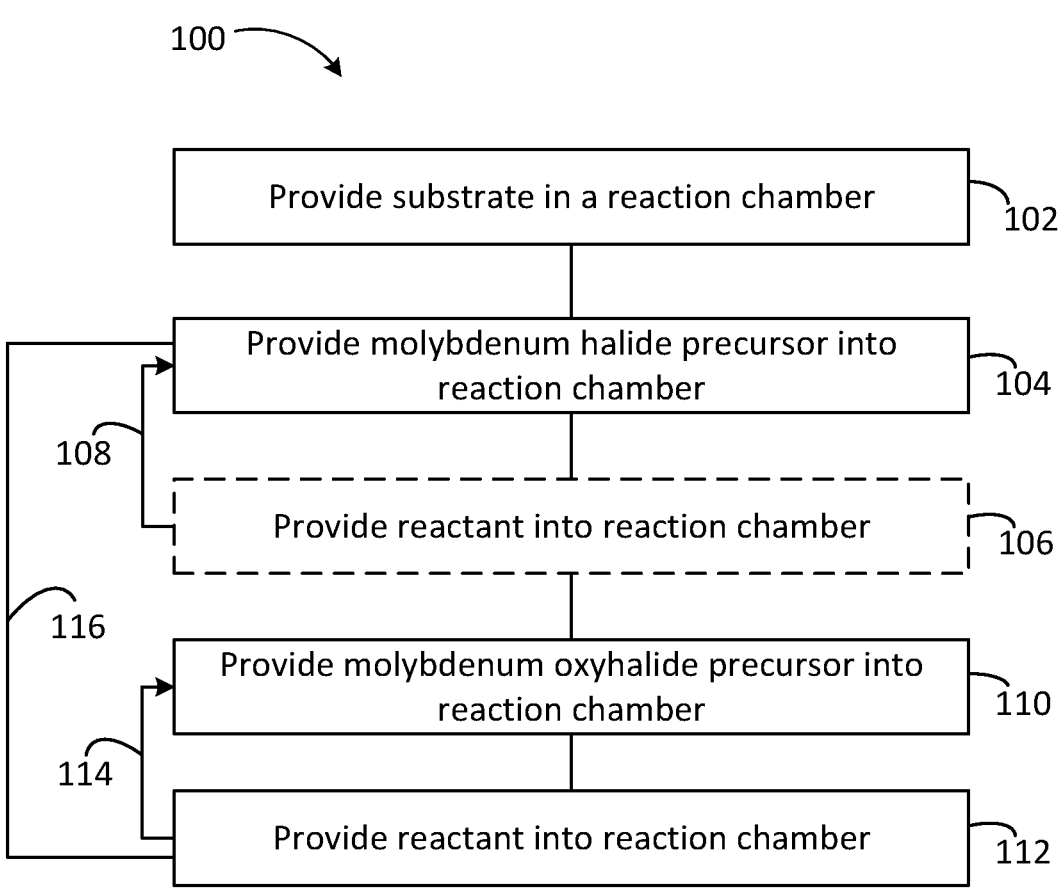
FIG. 1 is a block diagram of exemplary embodiments of method according to the current disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the current disclosure.

DETAILED DESCRIPTION

The description of exemplary embodiments of methods, structures, devices and deposition assemblies provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

General Process

In the current disclosure, a method of selectively depositing material comprising molybdenum on a first surface of a substrate relative to a second surface of the substrate by a cyclic deposition process is disclosed.

The deposition method according to the current disclosure comprises depositing material comprising molybdenum selectively on a substrate. The substrate may be any underlying material or materials that can be used to form, or upon which, a structure, a device, a circuit, or a layer can be formed. A substrate can include a bulk material, such as silicon (e.g., single-crystal silicon), other Group IV materials, such as germanium, or other semiconductor materials, such as a Group II-VI or Group III-V semiconductor materials, and can include one or more layers overlying or underlying the bulk material. Further, the substrate can include various features, such as recesses, protrusions, and the like formed within or on at least a portion of a layer of the substrate. For example, a substrate can include bulk semiconductor material and an insulating or dielectric material layer overlying at least a portion of the bulk semiconductor material. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers. Specifically, the substrate may comprise a partially fabricated semiconductor device.

In some embodiments, the substrate may be pretreated or cleaned prior to or at the beginning of the selective deposition process. In some embodiments, the substrate may be subjected to a plasma cleaning process at prior to or at the beginning of the selective deposition process. In some embodiments, a plasma cleaning process may not include ion bombardment, or may include relatively small amounts of ion bombardment. For example, in some embodiments, the substrate surface may be exposed to plasma, radicals, excited species, and/or atomic species prior to or at the beginning of the selective deposition process. In some embodiments, the substrate surface may be exposed to hydrogen plasma, radicals, or atomic species prior to or at the beginning of the selective deposition process. In some embodiments, a pretreatment or cleaning process may be carried out in the same reaction chamber as a selective deposition process. However, in some embodiments, a pretreatment or cleaning process may be carried out in a separate reaction chamber.

First Surface

A substrate according to the current disclosure comprises a first surface and a second surface. The first surface and the second surface have different material properties, allowing for the selective deposition of a material comprising molybdenum on the first surface. In some embodiments, the first surface is a metal or metallic surface. In some embodiments, a material comprising molybdenum is selectively deposited on a first surface comprising a metal or a metallic material relative to another surface. In some embodiments, a material comprising molybdenum, such as metallic molybdenum, is selectively deposited on a first conductive surface (such as a metal or metallic surface) of a substrate relative to a second dielectric surface of the substrate. In some embodiments, a material comprising molybdenum is selectively deposited on a first metal or metallic surface of a substrate relative to a second, low k surface.

In some embodiments, the metal or metallic surface is selected from a group consisting of elemental molybdenum surface, elemental tungsten surface, elemental ruthenium surface, elemental copper surface, elemental cobalt surface, vanadium nitride surface, titanium carbide surface and titanium nitride surface.

In some embodiments, the first surface comprises, consists essentially of, or consists of, a metal nitride, such as TiN or VN. In some embodiments, the first surface comprises, consists essentially of, or consists of, a metal carbide, such as titanium carbide.

In embodiments in which the first surface comprises a metal, the surface is referred to as a metal surface. In some embodiments, a metal surface consists essentially of, or consists of one or more metals. A metal surface may be a metal surface or a metallic surface. In some embodiments the metal or metallic surface may comprise metal, metal nitrides, metal carbides and/or mixtures thereof. In some embodiments the metal or metallic surface may comprise surface oxidation. In some embodiments, the metal or metallic material of the metal or metallic surface is electrically conductive with or without surface oxidation. In some embodiments, metal or a metallic surface comprises molybdenum. In some embodiments, the metal or metallic surface consists essentially of, or consists of Mo. In some embodiments, a metal or metallic surface comprises, consists essentially of, or consists of Cu. In some embodiments, a metal or metallic surface comprises, consists essentially of, or consists of Co. In some embodiments, a metal or metallic surface comprises, consists essentially of, or consists of W. In some embodiments, a metal or metallic surface comprises, consists essentially of, or consists of Ru. In some embodiments, the metal or metallic surface comprises a conductive metal nitride, such as TiN or VN. In some embodiments, the metal or metallic surface comprises a conductive metal boride. In some embodiments, the metal or metallic surface comprises a conductive metal carbide, such as TiC. In some embodiments, the first surface comprises a metal selected from a group consisting of Mo, W, Ru, Co, Cu, Ti and V. In some embodiments, the metal of the first surface is substantially completely in elemental form.

In some embodiments, a material comprising molybdenum is selectively deposited on a first Cu surface relative to a second SiOC surface. In some embodiments, a material comprising molybdenum is selectively deposited on a first Cu surface relative to a second silicon oxide surface.

Second Surface

In some embodiments, the second surface is a dielectric surface. In some embodiments, the second surface is a low-k surface. In some embodiments, the second surface comprises an oxide. In some embodiments, the second surface comprises silicon. Examples of silicon-comprising dielectric materials include silicon oxide-based materials, including grown or deposited silicon dioxide, doped and/or porous oxides and native oxide on silicon. In some embodiments, the second surface comprises silicon oxide. In some embodiments, the second surface is a silicon oxide surface, such as a native oxide surface, a thermal oxide surface or a chemical oxide surface. In some embodiments, the second surface comprises carbon. In some embodiments, the second surface comprises silicon, oxygen and carbon. In some embodiments, the second surface comprises, consists essentially of, or consists of, SiOC. In some embodiments, the second surface is an etch-stop layer.

In some embodiments the first surface and the second surface, such as the metal or metallic surface and the dielectric surface are adjacent to each other on the substrate.

The term dielectric is used in the description herein for the sake of simplicity in distinguishing from the other surface, namely the metal or metallic surface. It will be understood by those skilled in the art that not all non-conducting surfaces are dielectric surfaces. In some embodiments, selective deposition processes taught herein can deposit on metal or metallic surfaces with minimal deposition on non-conductive dielectric surfaces.

In some embodiments, the second surface may comprise a silicon-based surface, for example SiOC. That is, in some embodiments, the second surface may comprise a low k surface. A low k surface may comprise, consist essentially of, or consists of, SiN, SiOC, SiCN.

Silicon nitride (SiN) can refer to a material that includes silicon and nitrogen. Silicon nitride need not necessarily be a stoichiometric composition. An amount of silicon can range from 5 to 60 at-%; an amount of carbon can range from about 40 to about 95 at-%. In some embodiments, SiN films may comprise one or more elements in addition to Si and N, such as H or C.

Silicon oxycarbide (SiOC) can refer to material that comprises silicon, oxygen, and carbon. As used herein, unless stated otherwise, SiOC is not intended to limit, restrict, or define the bonding or chemical state, for example, the oxidation state of any of Si, O, C, and/or any other element in the film. In some embodiments, SiOC thin films may comprise one or more elements in addition to Si, O, and C, such as H or N. In some embodiments, the SiOC films may comprise Si—C bonds and/or Si—O bonds. In some embodiments, the SiOC films may comprise Si—C bonds and Si—O bonds and may not comprise Si—N bonds. In some embodiments, the SiOC films may comprise Si—H bonds in addition to Si—C and/or Si—O bonds. In some embodiments, the SiOC films may comprise more Si—O bonds than Si—C bonds, for example, a ratio of Si—O bonds to Si—C bonds may be from about 1:10 to about 10:1. In some embodiments, the SiOC films may comprise from about 0% to about 50% carbon on an atomic basis (i.e. at-%). In some embodiments, the SiOC films may comprise from about 0.1 at-% to about 40 at-%, from about 0.5 at-% to about 30 at-%, from about 1 at-% to about 30 at-%, or from about 5 at-% to about 20 at-% carbon. In some embodiments, the SiOC films may comprise from about 0 at-% to about 70 at-% oxygen. In some embodiments, the SiOC films may comprise from about 10 at-% to about 70 at-%, from about 15 at-% to about 50 at-%, or from about 20 at-% to about 40 at-% oxygen. In some embodiments, the SiOC films may comprise about 0 at-% to about 50 at-% silicon. In some embodiments, the SiOC films may comprise from about 10 at-% to about 50 at-%, from about 15 at-% to about 40 at-%, or from about 20 at-% to about 35 at-% silicon. In some embodiments, the SiOC films may comprise from about 0.1 at-% to about 40 at-%, from about 0.5 at-% to about 30 at-%, from about 1 at-% to about 30 at-%, or from about 5 at-% to about 20 at-% hydrogen. In some embodiments, the SiOC films may not comprise nitrogen. In some other embodiments, the SiOC films may comprise from about 0 at-% to about 40 at-% nitrogen. By way of particular examples, SiOC films can be or include a layer comprising SiOCN. In some embodiments, silicon oxycarbide can be represented by the chemical formula $Si_zO_xC_y$, where z can range from about 0 to about 2, x can range from about 0 to about 2, and y can range from about 0 to about 5.

In some embodiments, a substrate comprising a first metal surface and a second dielectric surface is provided. In some embodiments, a substrate comprising a first metallic surface and a second dielectric surface is provided. In some embodiments, the second surface may be a $SiO_2$-based surface. In some embodiments, the second surface may comprise Si—O bonds. In some embodiments, the second surface may comprise a $SiO_2$-based low-k material. In some embodiments, the second surface may comprise more than about 30 at-%, or more than about 50 at-% of $SiO_2$. In certain embodiments the second surface may comprise a silicon dioxide surface.

Selectivity

The current disclosure relates to a selective deposition process, in which material comprising molybdenum is selectively deposited on the first surface of the substrate relative to the second surface of the substrate. Selectivity can be given as a percentage calculated by [(deposition on first surface)−(deposition on second surface)]/(deposition on the first surface). Deposition can be measured in any of a variety of ways. In some embodiments, deposition may be given as the measured thickness of the deposited material. In some embodiments, deposition may be given as the measured amount of material deposited.

In some embodiments, selectivity is greater than about 30%. In some embodiments, selectivity is greater than about 50%. In some embodiments, selectivity is greater than about 75% or greater than about 85%. In some embodiments, selectivity is greater than about 90% or greater than about 93%. In some embodiments, selectivity is greater than about 95% or greater than about 98%. In some embodiments, selectivity is greater than about 99% or even greater than about 99.5%. In embodiments, the selectivity can change over the duration or thickness of a deposition.

In some embodiments, deposition only occurs on the first surface and does not occur on the second surface. In some embodiments, deposition on the first surface of the substrate relative to the second surface of the substrate is at least about 80% selective, which may be selective enough for some particular applications. In some embodiments the deposition on the first surface of the substrate relative to the second surface of the substrate is at least about 50% selective, which may be selective enough for some particular applications.

In some embodiments, selective deposition is inherent, and no additional processing steps over those conveniently performed on a substrate are necessary.

Reaction Chamber

The method of depositing material comprising molybdenum according to the current disclosure comprises providing a substrate in a reaction chamber. In other words, a substrate is in a space where the deposition conditions can be controlled. The reaction chamber may be a single wafer reactor. Alternatively, the reaction chamber may be a batch reactor. The reaction chamber can form part of a vapor deposition assembly for manufacturing semiconductor devices. The processing assembly may comprise one or more multi-station processing chambers. The reaction chamber may be part of a cluster tool in which different processes are performed to form an integrated circuit. Various phases of method can be performed within a single reaction chamber, or they can be performed in multiple reaction chambers, such as reaction chambers of a cluster tool, or deposition stations of a multi-station processing chamber.

In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber may be single wafer ALD reactor. In some embodiments, the reaction chamber may be a high-volume manufacturing single wafer ALD reactor. In some embodiments, the reaction chamber may be a batch reactor for manufacturing multiple substrates simultaneously.

The reaction chamber can form part of an atomic layer deposition (ALD) assembly. The reaction chamber can form part of a chemical vapor deposition (CVD) assembly. In some embodiments, the method is performed in a single reaction chamber of a cluster tool, but other, preceding or subsequent, manufacturing steps of the structure or device are performed in additional reaction chambers of the same cluster tool. Optionally, an assembly including the reaction chamber can be provided with a heater to activate the reactions by elevating the temperature of one or more of the substrate and/or the reactants and/or precursors.

Molybdenum Precursors

The terms "precursor" and "reactant" can refer to molecules (compounds or molecules comprising a single element) that participate in a chemical reaction that produces another compound or an element. A precursor typically contains portions that are at least partly incorporated into the compound or element resulting from the chemical reaction in question. Such a resulting compound or element may be deposited on a substrate. In some instances, a reactant is a precursor. In other instances, the compound or element that results from the chemical reaction does not contain a portion of the reactant (an element or group within the reactant) and therefore the reactant is not a precursor. In the current disclosure, molybdenum halide precursor and a molybdenum oxyhalide precursor (together termed molybdenum precursors) are described.

In some embodiments, a precursor or a reactant is provided in a mixture of two or more compounds. In a mixture, the other compounds in addition to the precursor may be inert compounds or elements. In some embodiments, a precursor or a reactant is provided in a composition. Composition may be a solution or a gas in standard conditions. In some embodiments, molybdenum halide precursor is provided in a composition. In some embodiments, molybdenum oxyhalide precursor is provided in a composition. Compositions suitable for use as composition can include molybdenum precursor compound and an effective amount of one or more stabilizing agents. Composition may be a solution or a gas in standard conditions.

In the selective deposition methods according to the current disclosure, two molybdenum precursors are used. The coordinated use of two molybdenum precursors may enable or improve selective deposition of material comprising molybdenum. Without limiting the current disclosure to any specific theory, a molybdenum oxyhalide precursor may be used for primarily forming the deposited material comprising molybdenum on the first surface. Molybdenum halide precursor may be used to intermittently etch the material deposited with the molybdenum oxyhalide precursor. When some selectivity of deposition exists between the first surface and the second surface, the dosing of the molybdenum halide precursor may be adjusted to remove the material comprising molybdenum from the second surface, while some deposited material remains on the first surface. When repeated, this may lead into accumulation of the material comprising molybdenum on the first surface but not (or to lesser extent) on the second surface. In other words, the periodic etching through the molybdenum halide precursor may improve the contrast between the first surface and the second surface.

Dosing of the molybdenum halide precursor may be adjusted, for example, through frequency of the halide sub-cycle, molybdenum halide pulse length and processing temperature. Further, in some embodiments, only molybdenum halide precursor may be pulsed in the halide sub-cycle, optionally preceded and/or followed by purge, whereas in other embodiments, a reactant may also be pulsed during the halide sub-cycle. In some embodiments, molybdenum halide removes the deposited material at a rate from about $0.05$ nm min$^{-1}$ to about 20 nm min$^{-1}$.

Molybdenum halide precursor and molybdenum oxyhalide precursor may be in vapor phase when they are in a reaction chamber. The molybdenum precursors may be partially gaseous or liquid, or even solid at some points in time prior to being provided into the reaction chamber. In other words, molybdenum precursors may be solid, liquid or gaseous, for example, in a precursor vessel or other receptacle before delivery into a reaction chamber. Various means of bringing the molybdenum precursors into gas phase can be applied when it is delivered into the reaction chamber. Such means may include, for example, heaters, vaporizers, gas flow or applying lowered pressure, or any combination thereof. Thus, the methods according to the current disclosure may comprise heating the molybdenum precursors prior to providing them into the reaction chamber. In some embodiments, molybdenum halide precursor and/or molybdenum oxyhalide precursor are heated to at least 60° C., to at least 70° C., or to at least 90° C. or to at least 100° C. in the vessel. Also a precursor delivery system of a deposition assembly may be heated to improve the vapor phase delivery of the molybdenum precursor to the reaction chamber. The temperature of the precursor delivery system is selected to keep the molybdenum precursor in question in a vapor phase. The temperature of the precursor delivery system may be lower, higher or the same as the temperature of the vessel holding the given molybdenum precursor.

In this disclosure, "gas" can include material that is a gas at normal temperature and pressure (NTP), a vaporized solid and/or a vaporized liquid, and can be constituted by a single gas or a mixture of gases, depending on the context. Molybdenum halide precursor and molybdenum oxyhalide precursor may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor delivery system, other gas distribution device, or the like, can be used for, e.g., sealing the reaction space, and can include a seal gas.

A molybdenum halide precursor consists of molybdenum and halogen. In some embodiments, the halogen in the molybdenum halide precursor is selected from a group consisting of chlorine, fluorine, bromine and iodine. In some embodiments, the halogen in the molybdenum halide precursor is selected from a group consisting of chlorine and fluorine. In some embodiments, the halogen in the molybdenum halide precursor is chlorine. In some embodiments, the halogen in the molybdenum halide precursor is fluorine.

In some embodiments, the molybdenum halide precursor is selected from a group consisting of MoCl$_5$, MoCl$_6$ and MoF$_6$. In some embodiments, the molybdenum halide precursor is MoCl$_5$. In some embodiments, the molybdenum halide precursor is MoCl$_6$. In some embodiments, the molybdenum halide precursor is MoF$_6$.

A molybdenum oxyhalide precursor consists of molybdenum, oxygen and halogen. In some embodiments, the halogen in the molybdenum oxyhalide precursor is selected from a group consisting of chlorine, fluorine, bromine and iodine. In some embodiments, the halogen in the molybdenum oxyhalide precursor is selected from a group consisting of chlorine and fluorine. In some embodiments, the halogen in the molybdenum oxyhalide precursor is chlorine. In some embodiments, the molybdenum oxyhalide is selected from a group consisting of MoO$_2$Cl$_2$ and MoClO$_4$.

In some embodiments, a mixture of molybdenum and another transition metal, such as at least one of niobium (Nb), tantalum (Ta) and tungsten (W) may be deposited. In such embodiments, molybdenum halide precursor may be replaced or supplemented with a metal halide of one of the above metals. For example, NbCl$_5$, NbF$_5$, TaCl$_5$, TaF$_5$, TaI$_5$, TaBr$_5$, WCl$_{15}$, WCl$_6$ or WF$_6$ may be used. In such embodiments, doped material comprising molybdenum may be deposited. The doped material comprises at least one additional metal in addition to molybdenum.

Reactant

In the method according to the current disclosure, a reactant is provided into the reaction chamber in the oxyhalide sub-cycle. In some embodiments, a reactant is provided into the reaction chamber also in a halide sub-cycle. Thus, a reactant may be contacted with the substrate comprising a chemisorbed molybdenum oxyhalide precursor. The conversion of molybdenum precursor to molybdenum may take place at the substrate surface. In some embodiments, the conversion may take place at least partially in the gas phase. The term reactant can refer to a gas or a material that can become gaseous and that is capable of reacting with the molybdenum oxyhalide precursor, and in some embodiments, with the molybdenum halide precursor to deposit material comprising molybdenum on the first surface of the substrate.

In some embodiments, the halide sub-cycle comprises providing a reactant into the reaction chamber in a vapor phase. In some embodiments, the halide sub-cycle does not comprise providing a reactant into the reaction chamber. The pulsing of a reactant during the halide sub-cycle may affect the etching tendency or efficiency of the molybdenum halide precursor. In some embodiments, providing a reducing agent into the reaction chamber in the halide sub-cycle reduces etching by the molybdenum halide precursor. The reactant optionally provided into the reaction chamber in the halide sub-cycle may be the same reactant as in the oxyhalide sub-cycle, or it can be a different one.

In some embodiments, the reactant comprises a reducing agent. In some embodiments, the reactant is a reducing agent. In some embodiments, the reducing agent is selected from a group consisting of molecular hydrogen, hydrazine and derivatives of hydrazine. In some embodiments, the reducing agent is molecular hydrogen (H$_2$). In some embodiments, the reducing agent comprises molecular hydrogen (H$_2$). In some embodiments, the reducing agent is molecular hydrogen (H$_2$).

In some embodiments, the reactant comprises a silane, such as an alkylsilane. In some embodiments, the silane is a disilane. In some embodiments, the silane comprises hexamethyl disilane. A silane may be a reducing agent.

In some embodiments, the reactant is a nitrogen precursor. Each of the two molybdenum precursors and the reactant may be provided into the reaction chamber once, or multiple times before providing the nitrogen precursor into the reaction chamber. The term nitrogen precursor can refer to a gas or a material that can become gaseous and that can be represented by a chemical formula that includes nitrogen. In some cases, the chemical formula includes nitrogen and hydrogen. In some cases, the nitrogen precursor does not include diatomic nitrogen. The nitrogen precursor may be selected from one or more of molecular nitrogen ($N_2$), ammonia ($NH_3$), hydrazine ($NH_2NH_2$), a hydrazine derivative, a nitrogen-based plasma and other compounds comprising or consisting of nitrogen and hydrogen, such as a mixture of gaseous $H_2$ and $N_2$.

In some embodiments, the reducing agent is selected from a group consisting of molecular hydrogen, hydrazine and derivatives of hydrazine. In some embodiments, a nitrogen precursor comprises hydrazine. In some embodiments, the nitrogen precursor consists essentially of, or consists of hydrazine. In some embodiments the nitrogen precursor comprises hydrazine substituted by one or more alkyl or aryl substituents. In some embodiments the nitrogen precursor consists essentially of, or consists of hydrazine substituted by one or more alkyl or aryl substituents. In some embodiments, the hydrazine derivative comprises an alkyl-hydrazine including at least one of: tertbutylhydrazine ($C_4H_9N_2H_3$), methylhydrazine ($CH_3NHNH_2$), 1,1-dimethylhydrazine (($CH_3)_2NNH_2$), 1,2-dimethylhydrazine ($CH_3$) $NHNH(CH_3)$, ethylhydrazine, 1,1-diethylhydrazine, 1-ethyl-1-methylhydrazine, isopropylhydrazine, tert-butylhydrazine, phenylhydrazine, 1,1-diphenylhydrazine, 1,2-diphenylhydrazine, N-aminopiperidine, N-aminopyrrole, N-aminopyrrolidine, N-methyl-N-phenylhydrazine, 1-amino-1,2,3,4-tetrahydroquinoline, N-aminopiperazine, 1,1-dibenzylhydrazine, 1,2-dibenzylhydrazine, 1-ethyl-1-phenylhydrazine, 1-aminoazepane, 1-methyl-1-(m-tolyl)hydrazine, 1-ethyl-1-(p-tolyl)hydrazine, 1-aminoimidazole, 1-amino-2,6-dimethylpiperidine, N-aminoaziridine, or azo-tert-butane. Thus, depending on the process parameters, hydrazine and derivatives thereof may function as reducing agents and/or nitrogen precursors. Consequently, material comprising molybdenum may comprise, consist essentially of, or consist of, metallic molybdenum or molybdenum nitride.

In some embodiments, the reactant is a nitrogen precursor, and the nitrogen precursor comprises a plasma, such as $NH_3$ plasma, $N_2$ plasma and/or $N_2/H_2$ plasma. In some embodiments, the nitrogen-based plasma may be generated by the application of RF power to a nitrogen comprising gas and the nitrogen-based plasma may comprise atomic nitrogen (N), nitrogen ions, nitrogen radicals, and excited species of nitrogen. In some embodiments, the nitrogen-based plasma may further comprise additional reactive species, such as, by the addition of a further gas.

In some embodiments, the reactant is a nitrogen precursor, and the nitrogen precursor comprises only nitrogen and hydrogen. For example, a mixture of nitrogen gas and hydrogen gas may be used. In some embodiments, the nitrogen precursor is a mixture of gaseous $H_2$ and $N_2$. In some embodiments, the nitrogen precursor is selected from a group consisting of $NH_3$, $NH_2NH_2$, and mixture of gaseous $H_2$ and $N_2$. In some embodiments, the nitrogen precursor does not include diatomic nitrogen, i.e. the nitrogen precursor is a non-diatomic precursor. In some embodiments, the nitrogen precursor comprises ammonia. In some embodiments, the nitrogen precursor consists essentially of, or consists of ammonia. In some embodiments the nitrogen precursor comprises an alkylamine. In some embodiments the nitrogen precursor consists essentially of or consists of an alkylamine. Examples of alkylamines include dimethylamine, n-butylamine and t-butylamine.

Cyclic Deposition

Generally, in cyclic deposition processes according to the current disclosure, such as atomic layer deposition (ALD), a precursor is introduced to a reaction chamber and is chemisorbed to a substrate surface (e.g., a substrate surface that may include a previously deposited material from a previous deposition cycle or other material). In some embodiments, the precursor on the substrate surface does not readily react with additional precursor (i.e., the deposition of the precursor may be a partially or fully self-limiting reaction). Thereafter, another precursor or a reactant may be introduced into the reaction chamber for use in converting the chemisorbed precursor to the desired material on the deposition surface. The second precursor or a reactant can be capable of further reaction with the precursor. Purging steps may be utilized during one or more cycles, e.g., during each step of each cycle, to remove any excess precursor from the process chamber and/or remove any excess reactant and/or reaction byproducts from the reaction chamber. Thus, in some embodiments, the cyclic deposition process comprises purging the reaction chamber after providing a precursor into the reaction chamber. In some embodiments, the cyclic deposition process comprises purging the reaction chamber after providing a first precursor, such as a molybdenum precursor, for example a molybdenum halide precursor or a molybdenum oxyhalide precursor, into the reaction chamber. In some embodiments, the cyclic deposition process comprises purging the reaction chamber after providing a second precursor or a reactant into the reaction chamber. In some embodiments, the cyclic deposition process comprises purging the reaction chamber after providing a molybdenum precursor into the reaction chamber, and after providing a reactant into the reaction chamber. In some embodiments, the molybdenum oxyhalide precursor and the reactant are provided into the reaction chamber alternately and sequentially. In some embodiments, the molybdenum halide precursor and the reactant are provided into the reaction chamber alternately and sequentially. In some embodiments, The method according to the current disclosure is an ALD method.

The method according to the current disclosure may comprise one or more cyclic phases. In some embodiments, the process comprises or one or more acyclic (i.e. continuous) phases. In some embodiments, the deposition process comprises the continuous flow of at least one precursor or a reactant.

Super-Cycle

In the current disclosure, the deposition method comprises at least one super-cycle. At least one super-cycle comprises a halide sub-cycle and an oxyhalide sub-cycle. In some embodiments, at least about half of the super-cycles comprise a halide sub-cycle and an oxyhalide sub-cycle. In some embodiments, substantially all of the super-cycles comprise a halide sub-cycle and an oxyhalide sub-cycle.

The halide sub-cycle according to the current disclosure comprises providing molybdenum halide precursor into the reaction chamber in a vapor phase. The purpose of the halide sub-cycle is to improve selectivity of the deposition process. Without limiting the current disclosure to any specific theory, the molybdenum halide precursor may etch deposited molybdenum. The molybdenum halide precursor may participate in deposition of material comprising molybdenum. The balance between etching and deposition by the molybdenum halide precursor may be regulated by selection of the conditions in the reaction chamber, such as temperature, pressure and the availability of a reactant. In some embodiments, the molybdenum halide precursor pulse length is from about 0.5 seconds to about 1 minute, or from about 1 second to about 1 minute, or from about 5 seconds to about 1 minute, or from about 10 seconds to about 1 minute, or from about 20 seconds to about 1 minute.

In some embodiments, the halide sub-cycle comprises providing a reactant into the reaction chamber in a vapor phase. Providing a reactant into the reaction chamber may reduce the etching property of the molybdenum halide precursor. The etching may be adjusted by at least partially overlapping pulses of molybdenum halide precursor and a reactant. In some embodiments, molybdenum halide precursor and a reactant are provided into the reaction chamber alternately and sequentially. In some embodiments, molybdenum halide precursor and a reactant are provided into the reaction chamber at least partially simultaneously. In some embodiments, molybdenum halide precursor and a reactant are provided into the reaction chamber at least partially separately.

The oxyhalide sub-cycle of the present disclosure comprises providing molybdenum oxyhalide precursor into the reaction chamber in a vapor phase and providing a reactant into the reaction chamber to deposit material comprising molybdenum on the first surface of the substrate. The molybdenum oxyhalide precursor and the reactant may form material comprising molybdenum on the first surface of the substrate.

In some embodiments, the ratio of halide sub-cycles to oxyhalide sub-cycles in at least one super-cycle is from 1:1 to 1:200. In some embodiments, the ratio of halide sub-cycles to oxyhalide sub-cycles in at least one super-cycle is from 1:1 to 1:100. In some embodiments, the ratio of halide sub-cycles to oxyhalide sub-cycles in at least one super-cycle is from 1:1 to 1:50. Depending on the deposition conditions, keeping the process selective may necessitate performing halide sub-cycle frequently, such that the ratio of halide sub-cycles to oxyhalide sub-cycles in at least one super-cycle is from 1:1 to 1:20 or from 1:1 to 1:10. In some embodiments, the ratio of halide sub-cycles to oxyhalide sub-cycles in at least one super-cycle is from 1:2 to 1:50 or from 1:3 to 1:50 or from 1:5 to 1:50. In some embodiments, the ratio of halide sub-cycles to oxyhalide sub-cycles in at least one super-cycle is from 1:10 to 1:50 or from 1:15 to 1:50 or from 1:20 to 1:50 or from 1:30 to 1:50. In some embodiments, the ratio of halide sub-cycles to oxyhalide sub-cycles is the same in most or in substantially all super-cycles.

In some embodiments, at least one super-cycle comprises from 1 to 100 oxyhalide sub-cycles. In some embodiments, at least one super-cycle comprises from 1 to 50 oxyhalide sub-cycles. The number of oxyhalide sub-cycles may depend, for example from the growth speed and selectivity of the oxyhalide deposition process. In some embodiments, a super-cycle comprises one halide sub-cycle and one oxyhalide sub-cycle. In some embodiments, a super-cycle comprises one halide sub-cycle and two oxyhalide sub-cycles. In some embodiments, a super-cycle comprises one halide sub-cycle and three oxyhalide sub-cycles. In some embodiments, a super-cycle comprises one halide sub-cycle and about five oxyhalide sub-cycles. In some embodiments, a super-cycle comprises one halide sub-cycle and about ten oxyhalide sub-cycles. In some embodiments, a super-cycle comprises one halide sub-cycle and about 20 oxyhalide sub-cycles. In some embodiments, a super-cycle comprises one halide sub-cycle and about 30 oxyhalide sub-cycles. In some embodiments, a super-cycle comprises one halide sub-cycle and about 50 oxyhalide sub-cycles.

In some embodiments, the super-cycle is performed from 2 to about 1,500 times. The number of times a super-cycle is performed depends, for example, on the target thickness and growth speed of the material comprising molybdenum. In some embodiments, the super-cycle is performed from 2 to about 1,000 times. In some embodiments, the super-cycle is performed from 2 to about 800 times. In some embodiments, the super-cycle is performed from 2 to about 500 times. In some embodiments, the super-cycle is performed from 2 to about 200 times. In some embodiments, the super-cycle is performed from about 10 to about 1,500 times. In some embodiments, the super-cycle is performed from about 50 to about 1,500 times. In some embodiments, the super-cycle is performed from about 100 to about 1,500 times.

Pulses

In some embodiments, at least one of molybdenum precursor, such as molybdenum halide precursor and molybdenum oxyhalide precursor, and a reactant is provided to the reaction chamber in pulses. In some embodiments, the molybdenum precursor is supplied in pulses and the reactant is supplied in pulses, and the reaction chamber is purged between consecutive pulses of molybdenum precursor and the reactant. A duration of providing molybdenum precursor and/or a reactant into the reaction chamber (i.e. molybdenum precursor pulse time and reactant pulse time, respectively) may be, for example, from about 0.01 s to about 60 s, for example from about 0.01 s to about 5 s, or from about 1 s to about 20 s, or from about 0.5 s to about 10 s, or from about 5 s to about 15 s, or from about 10 s to about 30 s, or from about 10 s to about 60 s, or from about 20 s to about 60 s. The duration of molybdenum precursor or a reactant pulse may be, for example 0.03 s, 0.1 s, 0.5 s, 1 s, 1.5 s, 2 s, 2.5 s, 3 s, 4 s, 5 s, 8 s, 10 s, 12 s, 15 s, 25 s, 30 s, 40 s, 50 s or 60 s. In some embodiments, molybdenum precursor pulse time may be at least 5 seconds, or at least 10 seconds. In some embodiments, molybdenum precursor pulse time may be at most 5 seconds, or at most 10 seconds or at most 20 seconds, or at most 30 seconds. In some embodiments, reactant pulse time may be at least 5 seconds, or at least 10 seconds, or at least 20 seconds. In some embodiments, reactant pulse time may be at most 5 seconds, or at most 10 seconds or at most 20 seconds, or at most 30 seconds.

The pulse times for molybdenum halide precursor, molybdenum oxyhalide precursor and for reactant vary independently according to process in question. The selection of an appropriate pulse time may depend on the substrate topology. For higher aspect ratio structures, longer pulse times may be needed to obtain sufficient surface saturation in different areas of a high aspect ratio structure. Also the selected molybdenum precursor and reactant chemistries may influence suitable pulsing times. For process optimization purposes, shorter pulse times might be preferred as long as appropriate layer properties can be achieved. In some embodiments, molybdenum precursor pulse time is longer than reactant pulse time. In some embodiments, reactant pulse time is longer than molybdenum precursor pulse time. In some embodiments, molybdenum precursor pulse time is the same as reactant pulse time.

In some embodiments, providing molybdenum precursor and/or a reactant into the reaction chamber comprises pulsing the molybdenum precursor and the reactant over a substrate. In certain embodiments, pulse times in the range of several minutes may be used for the molybdenum precursor and/or the reactant. In some embodiments, molybdenum precursor may be pulsed more than one time, for example two, three or four times, before a reactant is pulsed to the reaction chamber. Similarly, there may be more than one pulse, such as two, three or four pulses of a reactant before molybdenum precursor is pulsed (i.e. provided) into the reaction chamber.

Purging

As used herein, the term "purge" refers to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a precursor and a reactant. Purging may avoid or at least reduce gas-phase interactions between the two gases reacting with each other. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain or another means of separating the two spaces, to a second location to which a second precursor is continually supplied. Purging times may be, for example, from about 0.01 seconds to about 20 seconds, from about 0.05 s to about 20 s, or from about 1 s to about 20 s, or from about 0.5 s to about 10 s, or between about 1 s and about 7 seconds, such as 5 s, 6 s or 8 s. However, other purge times can be utilized if necessary, such as where highly conformal step coverage over extremely high aspect ratio structures or other structures with complex surface morphology is needed, or in specific reactor types, such as a batch reactor, may be used.

In some embodiments, the method comprises removing excess molybdenum precursor from the reaction chamber by an inert gas prior to providing the reactant in the reaction chamber. In some embodiments, the reaction chamber is purged between providing molybdenum precursor in a reaction chamber and providing a reactant in the reaction chamber. In some embodiments, there is a purge step after every precursor and reactant pulse. Thus, the reaction chamber may be purged also between two pulses of the same chemistry, such as molybdenum precursor or a reactant.

Thermal Process

In some embodiments, the cyclic deposition process according to the current disclosure comprises a thermal deposition process. In thermal deposition, the chemical reactions are promoted by temperature regulation, such as increased temperature relevant to ambient temperature. Generally, temperature increase provides the energy needed for the formation of material comprising molybdenum in the absence of other external energy sources, such as plasma, radicals, or other forms of radiation. In some embodiments, the methods according to the current disclosure do not comprise plasma-enhanced phases. In some embodiments, the method according to the current disclosure is a plasma-enhanced deposition method, for example PEALD or PECVD. Thus, in some embodiments, the methods according to the current disclosure comprise plasma-enhanced phases. For example, reactant may be hydrogen plasma.

In some embodiments, material comprising molybdenum may be deposited at a temperature from about 250° C. to about 550° C. For example, material comprising molybdenum may be deposited at a temperature from about 300° C. to about 550° C., or at a temperature from about 350° C. to about 550° C., or at a temperature from about 400° C. to about 550° C. In some embodiments of the current disclosure, material comprising molybdenum may be deposited at a temperature from about 250° C. to about 500° C., or at a temperature from about 300° C. to about 500° C., or at a temperature from about 400° C. to about 500° C. A temperature in a reaction chamber may be selected independently for different phases of the process. In some embodiments, the whole process is performed at a substantially constant temperature.

A pressure in a reaction chamber may be selected independently for different phases of the process. However, in some embodiments, the whole process is performed at a substantially constant pressure. In some embodiments, a first pressure may be used during a halide sub-cycle, and a second pressure may be used during the oxyhalide-sub-cycle. A third or a further pressure may be used during purging or other process steps. In some embodiments, a pressure within the reaction chamber during the deposition process according to the current disclosure is less than about 760 Torr, or a pressure within the reaction chamber during the deposition process is between about 0.05 Torr and about 760 Torr, or between about 0.05 Torr and about 100 Torr, or between about 0.05 Torr and about 50 Torr, or between about 0.05 Torr and about 20 Torr, or between about 0.05 Torr and about 10 Torr. In some embodiments, a pressure within the reaction chamber during the deposition process is less than about 0.1 Torr, less than about 1 Torr, less than 10 Torr, less than about 20 Torr, less than about 50 Torr or less than about 100 Torr. In some embodiments, a pressure within the reaction chamber during at least a part of the method according to the current disclosure is less than about 0.01 Torr, less than about 0.1 Torr, less than about 1 Torr, less than about 10 Torr or less than about 20 Torr, less than about 50 Torr or less than about 100 Torr. For example, in some embodiments, a first pressure may be about 0.5 Torr, about 1 Torr, about 5 Torr, about 7 Torr, about 9 Torr, about 15 Torr or about 20 Torr. In some embodiments, a second pressure may be about 0.5 Torr, about 1 Torr, about 5 Torr, about 7 Torr, about 9 Torr, about 15 Torr or about 20 Torr.

Deposited Material

As used herein, the term "material comprising molybdenum" may refer to a material comprising at least molybdenum. In some embodiments, the material comprises, consists essentially of, or consists of Mo.

The composition of the material comprising molybdenum may depend on the specific molybdenum precursor and reactant used in the process, as well as on the deposition temperature and the composition of the first surface of the substrate. In some embodiments, the material comprising molybdenum contains at least 50 at-% molybdenum. In some embodiments, the material comprising molybdenum contains at least 70 at-% molybdenum. In some embodiments, the material comprising molybdenum contains at least 80 at-% molybdenum. In some embodiments, the material comprising molybdenum contains at least 90 at-% molybdenum. In some embodiments, the material comprising molybdenum contains at least 95 at-% molybdenum. In some embodiments, the material comprising molybdenum contains at least 97 at-% molybdenum. In some embodiments, molybdenum layer may consist essentially of, or consist of molybdenum. Material consisting of molybdenum may include an acceptable amount of impurities, such as oxygen, carbon, chlorine or other halogen, and/or hydrogen that may originate from one or more precursors used to deposit the material comprising molybdenum. In some embodiments, molybdenum in the deposited material is at least partially in elemental form (i.e. has an oxidation state of 0). In some embodiments, molybdenum in the deposited material is substantially completely, or completely, in elemental form.

Material comprising molybdenum may comprise carbon. In some embodiments, the carbon content of material comprising molybdenum is lower than about 30 at-%. In some embodiments, the carbon content of material comprising molybdenum is lower than about 15 at-%. In some embodiments, the carbon content of material comprising molybdenum is lower than about 10 at-%. In some embodiments, the carbon content of material comprising molybdenum is lower than about 5 at-%.

In some embodiments, material comprising molybdenum comprises nitrogen. In some embodiments, the nitrogen content of material comprising molybdenum is lower than about 40 at-%. In some embodiments, the nitrogen content of material comprising molybdenum is lower than about 20 at-%. In some embodiments, the nitrogen content of material comprising molybdenum is lower than about 15 at-%. In some embodiments, the nitrogen content of material comprising molybdenum is lower than about 10 at-%. In some embodiments, molybdenum in the deposited material is at least partially in nitride form. In some embodiments, material comprising molybdenum comprises from about 60 to about 99 atomic percentage (at-%) molybdenum and nitrogen, or about 75 to about 99 at-% molybdenum and nitrogen, or about 75 to about 95 at-% molybdenum and nitrogen, or about 75 to about 89 at-% molybdenum and nitrogen. Material comprising molybdenum deposited by a method according to the current disclosure may comprise, for example about 80 at-%, about 83 at-%, about 85 at-%, about 87 at-%, about 90 at-%, about 95 at-%, about 97 at-% or about 99 at-% molybdenum and nitrogen. In some embodiments, the Mo layer may comprise less than about 30 at-%, or less than about 20 at-%, less than about 10 at-%, less than about 8 at-%, less than about 7 at-%, less than about 5 at-%, or less than about 2 at-% oxygen.

In some embodiments, molybdenum is deposited on a first surface of a substrate as a layer. In such embodiments, molybdenum layer is formed. As used herein, the term "layer" and/or "film" can refer to any continuous or non-continuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a non-continuous layer serving to increase the rate of nucleation of another material. However, the seed layer may also be substantially or completely continuous.

Without limiting the current disclosure to any specific theory, in some embodiments it may be possible to produce molybdenum (Mo) layers with low resistivity. The resistivity of Mo layer according to the current disclosure may be lower than about 500 $\mu\Omega$ cm, such as about 400 $\mu\Omega$ cm. In some embodiments, the resistivity of Mo layer is lower than about 300 $\mu\Omega$ cm, such as 250 $\mu\Omega$ cm. In some embodiments, the resistivity of Mo layer is lower than about 200 $\mu\Omega$ cm, such as about 170 $\mu\Omega$ cm. Especially, Mo layer, i.e. layer according to the current disclosure comprising Mo, or comprising substantially only Mo, may have a resistivity below about 200 $\mu\Omega$ cm. In embodiments, in which the Mo layer comprises molybdenum nitride (MoN), the resistivity may be higher than indicated above. The lowest resistivities are typically obtained for Mo layers comprising elemental molybdenum metal. For example, Mo layer may consist substantially of elemental molybdenum, in which case the resistivity may be low.

DRAWINGS

The disclosure is further explained by the following exemplary embodiments depicted in the drawings. The illustrations presented herein are not meant to be actual views of any particular material, structure, device or an apparatus, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

FIG. 1 is a block diagram of an exemplary embodiment of a method 100 of selectively depositing a material comprising molybdenum on a substrate. Method 100 may be used to form a layer comprising molybdenum, i.e. molybdenum layer. The molybdenum layer can be used during a formation of a structure or a device, such as a structure or a device described herein. However, unless otherwise noted, methods described herein are not limited to such applications.

In the first phase 102, a substrate is provided in a reaction chamber. A substrate according to the current disclosure comprises a first surface and a second surface. The first surface may be a metal surface or metallic surface. The metal or metallic surface may comprise metal, metal nitrides, metal carbides and/or mixtures thereof, with or without surface oxidation. In some embodiments, the metal or metallic material of the metal or metallic surface is electrically conductive. For example, the first surface may comprise elemental metal, or conductive metal nitride, or conductive metal carbide. The metal comprised in the first surface may be molybdenum. In some embodiments, a metal surface consists essentially of, or consists of one or more metals. Non-limiting exemplary metals of the first surface are Cu, Co, W, Ru, Mo, Ti and V. The metal of the first surface may be substantially completely, or completely in elemental form. Exemplary metal nitrides include TiN and VN. Exemplary metal carbides include TiC, TiAlC and TaC.

The second surface of the substrate may be a dielectric surface, such as a low-k surface. Exemplary low k surfaces include SiOC. The second surface may comprise an oxide, such as silicon oxide. The second surface may comprise silicon, such as $SiO_2$, or the above-mentioned SiOC. In some embodiments, the second surface comprises carbon. In some embodiments, the second surface comprises silicon, oxygen and carbon.

The reaction chamber can form part of an atomic layer deposition (ALD) assembly. The assembly may be a single wafer reactor. Alternatively, the reactor may be a batch reactor. Various phases of method 100 can be performed within a single reaction chamber or they can be performed in multiple reaction chambers, such as reaction chambers of a cluster tool or in deposition stations of a multi-station reaction chamber. In some embodiments, the method 100 is performed in a single reaction chamber of a cluster tool, but other, preceding or subsequent, manufacturing steps of the structure or device are performed in additional reaction chambers of the same cluster tool. Optionally, an assembly including the reaction chamber can be provided with a heater to activate the reactions by elevating the temperature of one or more of the substrate and/or the reactants and/or precursors. The material comprising molybdenum according to the current disclosure may be deposited in a cross-flow reaction chamber. The material comprising molybdenum according to the current disclosure may be deposited in a showerhead reaction chamber.

During step 102, the substrate can be brought to a desired temperature and pressure for performing the method according to the current disclosure, i.e. providing precursors and/or reactants into the reaction chamber. A temperature (for example temperature of a substrate or a substrate support) within a reaction chamber can be, for example, from about 250° C. to about 550° C., from about 350° C. to about 500° C., from about 400° C. to about 550° C. or from about 250° C. to about 450° C. In an exemplary embodiment, a temperature of 500° C. at most may be used to deposit material comprising molybdenum.

A pressure within the reaction chamber can be less than 200 Torr, or less than 100 Torr, or less than 80 Torr, or less than 50 Torr. For example, a pressure in the reaction chamber may be about 70 Torr, about 50 Torr, about 20 Torr, about 10 Torr, about 5 Torr or about 1 Torr. Different pressure may be used for different process steps.

Molybdenum halide precursor is provided into the reaction chamber comprising the substrate at phase 104. Without limiting the current disclosure to any specific theory, molybdenum halide precursor may etch materials on the surface of the substrate during providing molybdenum halide precursor into the reaction chamber. The duration of providing molybdenum halide precursor into the reaction chamber (molybdenum halide precursor pulse time) may be, for example, 0.5 s, 1 s, 2 s, 5 s, 8 s, 10 s, 15 s or 20 s. In some embodiments, the molybdenum halide precursor pulse time may be longer than 1 s or longer than 5 s or longer than 10 s or longer than 20 s. The reaction chamber may be purged after molybdenum halide pulse (i.e. providing molybdenum halide precursor into the reaction chamber).

Reactant may be optionally provided into the reaction chamber at phase 106 (indicated by de dashed outline). A reactant, such as a reducing agent, such as molecular hydrogen, may react with the chemisorbed molybdenum halide precursor, or its derivate species, to form material comprising molybdenum on the first surface of the substrate. The duration of providing reactant in the reaction chamber (reactant pulse time) may be, for example 0.1 seconds (s), 0.5 s, 1 s, 3 s, 4 s, 5 s, 7 s, 10 s, 11 s, 15 s or 20 s. In some embodiments, the duration of providing reactant in the reaction chamber is shorter than 20 s, shorter than 10 s, shorter than 3 s or about 1 s.

In some embodiments, molybdenum halide precursor may be heated before providing it into the reaction chamber. In some embodiments, reactant is heated before providing it to the reaction chamber. In some embodiments, the molybdenum halide precursor is held in ambient temperature before providing it to the reaction chamber. In some embodiments, the reactant is held in ambient temperature before providing it to the reaction chamber.

Phase 104 and optional phase 106, optionally together with a purge may form a halide sub-cycle 108. The halide sub-cycle may be repeated. For example, multiple pulses of molybdenum halide precursor may be performed, with purge in between. If a reactant is used, the halide sub-cycle may comprise performing phase 104 and 106 alternately and sequentially in any order. As described above, phases 104 and 106 may overlap at least partially.

After a predetermined number, such as from 1 to 50, for example 2, 5 or 10, of halide sub-cycles has been performed, an oxyhalide sub-cycle is performed. The temperature and pressure of the reaction chamber may remain the same as during the halide sub-cycle.

The oxyhalide sub-cycle may be initiated by phase 110 of providing a molybdenum oxyhalide precursor into the reaction chamber comprising the substrate. Alternatively, the oxyhalide sub-cycle may be initiated by phase 112 of providing a reactant into the reaction chamber. Without limiting the current disclosure to any specific theory, molybdenum oxyhalide precursor may chemisorb on the first surface of the substrate during providing molybdenum oxyhalide precursor into the reaction chamber (i.e. molybdenum oxyhalide pulse). The duration of providing molybdenum oxyhalide precursor into the reaction chamber (molybdenum oxyhalide precursor pulse time) may be, for example, 0.5 s, 1 s, 2 s, 5 s, 8 s, 10 s, 15 s or 20 s. In some embodiments, the molybdenum oxyhalide precursor pulse time may be longer than 1 s or longer than 5 s or longer than 10 s or longer than 20 s. The reaction chamber may be purged after molybdenum oxyhalide pulse (i.e. providing molybdenum oxyhalide precursor into the reaction chamber).

Reactant is provided into the reaction chamber at phase 112. A reactant, such as a reducing agent, such as molecular hydrogen, may react with the chemisorbed molybdenum oxyhalide precursor, or its derivate species, to form material comprising molybdenum on the first surface of the substrate. The duration of providing reactant in the reaction chamber (reactant pulse time) may be, for example 0.1 seconds (s), 0.5 s, 1 s, 3 s, 4 s, 5 s, 7 s, 10 s, 11 s, 15 s or 20 s. In some embodiments, the duration of providing reactant in the reaction chamber is shorter than 20 s, shorter than 10 s, shorter than 3 s or about 1 s.

Phases 110 and 112, optionally together with one or more purge phases may form an oxyhalide sub-cycle 114. The oxyhalide sub-cycle 114 may be repeated. The oxyhalide sub-cycle may form the majority of the deposited material comprising molybdenum on the first surface of the substrate. The oxyhalide sub-cycle may be repeated for, for example, from 1 to 150 times, such as about 5, about 10, about 25, about 50 or about 100 times. Further, multiple pulses of molybdenum oxyhalide precursor may be performed, with a purge in between before providing a reactant into the reaction chamber. The oxyhalide sub-cycle may comprise performing phase 110 and 112 alternately and sequentially in any order. Phases 110 and 112 may overlap at least partially.

Repeating phases 110 and 112 results in the deposition of material comprising molybdenum on the first surface of the substrate. In some embodiments, the two phases of oxyhalide sub-cycle, namely providing the molybdenum oxyhalide precursor and the reactant in the reaction chamber (110 and 112, respectively), may be repeated (loop 114). Such embodiments may contain several oxyhalide sub-cycles.

After a predetermined number of oxyhalide sub-cycles 114 have been performed, a halide sub-cycle 108 may be performed again. This forms a super-cycle 116. The number of halide sub-cycles 108 and oxyhalide sub-cycles 114, as well as ratio of halide sub-cycles 108 to oxyhalide sub-cycles 114 is selected based on how much improvement of selectivity is needed in the process by performing halide sub-cycles 108. The frequency of halide sub-cycles relative to oxyhalide sub-cycles depends on the growth speed and level of selectivity of the process. In some embodiments, deposition speed of 0.5 to 1.5 Å/oxyhalide sub-cycle may be observed. In some embodiments, the growth speed of the material comprising molybdenum is about 0.6 Å/oxyhalide sub-cycle, or about 0.7 Å/oxyhalide sub-cycle or about 1 Å/oxyhalide sub-cycle. The experiments performed by the inventors have also preliminarily indicated that etching may be advantageous after from about 3 nm to about 10 nm of deposition. Thus, halide sub-cycle may be performed after every 2 to every 20 oxyhalide sub-cycles The thickness of the deposited material comprising molybdenum may be regulated by adjusting the number of super-cycles 116. The super-cycle 116 may be repeated until a desired thickness of material comprising molybdenum is achieved. For example, about 10, 20, 30, 50, 100, 200, 500, or 1,000 super-cycles may be performed.

In some embodiments, molybdenum oxyhalide precursor may be heated before providing it into the reaction chamber. In some embodiments, reactant is heated before providing it to the reaction chamber during an oxyhalide sub-cycle. In some embodiments, the molybdenum oxyhalide precursor is held in ambient temperature before providing it to the reaction chamber. In some embodiments, the reactant is held in ambient temperature before providing it to the reaction chamber for oxyhalide sub-cycle.

Depending on the deposition conditions, deposition cycle numbers etc., molybdenum layers of variable thickness may be deposited. For example, molybdenum layer may have a thickness between approximately 0.2 nm and 100 nm, or between about 0.5 nm and 60 nm, or between about 0.5 nm and 30 nm, or between about 0.5 nm and 50 nm, or between about 1 nm and 60 nm, or between about 2 nm and 60 nm, or between about 5 nm and 60 nm. Molybdenum layer may have a thickness of, for example, approximately 0.2 nm, 0.3 nm, 0.5 nm, 1 nm, 1.5 nm, 2 nm, 2.5 nm, 3 nm, 3.5 nm, 4 nm, 4.5 nm, 5 nm, 6 nm, 8 nm, 10 nm, 15 nm, 20 nm, 25 nm, 30 nm, 35 nm, 40 nm, 50 nm, 70 nm, 85 nm or 100 nm. The desired thickness may be selected according to the application in question.

For clarity, the order of process phases depicted in FIG. 1 is exemplary only, and the order of the precursors and reactants, as well as the loop repetitions may be selected according to the specific embodiment at hand. Further, in some embodiments, the first one, two, three or four precursor pulses of each phase may comprise different pulsing times than the rest of the corresponding sub-cycles.

The properties of the material comprising molybdenum depend on the deposition parameters, such as the precursors and reactants, cycling scheme, and temperature and pressure during deposition. For example, for molybdenum nitride, a carbon content of 10 at-% or less, for example about 5 at-% or about 7 at-% may be achieved.

In some non-limiting exemplary experiments, selective deposition of material comprising molybdenum was performed. In certain experiments, molybdenum was deposited on a first surface, wherein the first surface was a copper surface. The second surface was a SiOC-comprising low k surface.

Figure 2:
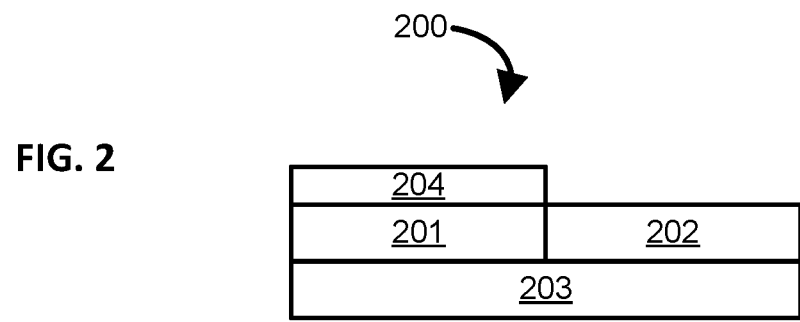
FIG. 2 is a schematic presentation of a molybdenum layer deposited according to the current disclosure on a first surface of a substrate relative to a second surface of the same substrate.

FIG. 2 illustrates an exemplary structure, or a portion of a device, 200 in accordance with the disclosure in a schematic manner. Portion of a device or structure 200 includes a substrate 203 comprising a first surface 201 and a second surface 202. Molybdenum layer 204 is deposited on the first surface 201, but not on the second surface 202. The first surface 201 and the second surface 202 may comprise or consist of materials as described herein.

A material comprising molybdenum 204 is deposited selectively on a first surface of a substrate 201 relative to a second surface of the same substrate 202. In the drawing, a substrate 203 comprising a first surface 201 and a second surface 202 is depicted. The first surface 201 may be, for example, a metal surface, such as Cu or Ru surface, as explained in more detail above. The second surface 202 may be, for example, a dielectric surface, such as SiOC or other low k material surface. Although the two surfaces are schematically presented as being in one plane of equal thickness and positioned directly on the substrate 203, other configurations of the first surface 201 and second surface 202 are possible. For example, one of them may be lower or higher than the other, and one or both of them may comprise three-dimensional structures, and there may be one or more additional layers between the substrate 203 and the first surface and/or second surface, respectively. Further, there may be additional surfaces present on the substrate, and one or more of the surfaces on the substrate 203 may be partially embedded in the substrate 203 material.

Figure 3:
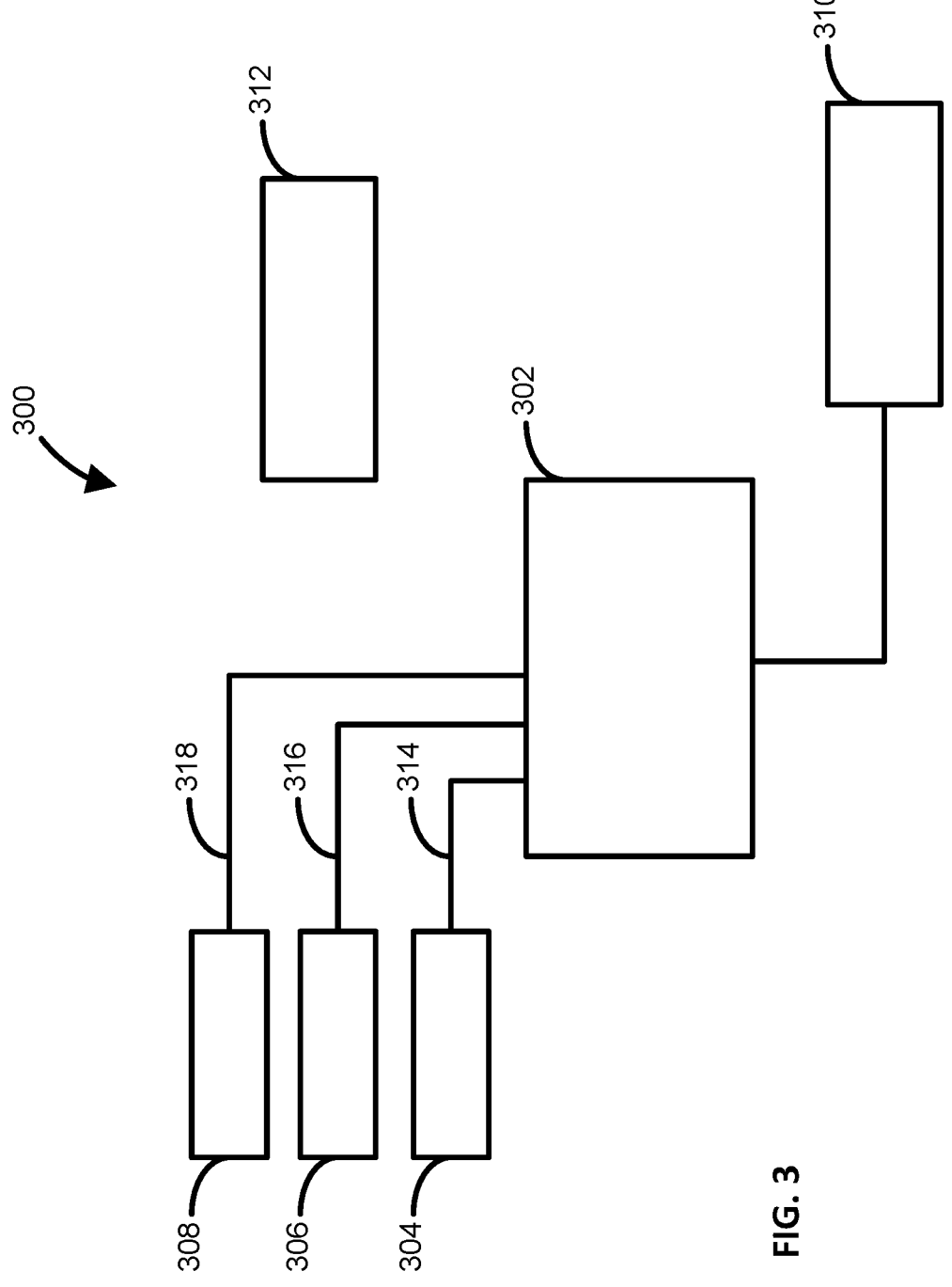
FIG. 3 is a schematic presentation of a vapor deposition assembly according to the current disclosure.

FIG. 3 illustrates a vapor deposition assembly 300 according to the current disclosure in a schematic manner. Deposition assembly 300 can be used to perform a method as described herein and/or to form a structure or a device, or a portion thereof as described herein.

A vapor deposition assembly according to the current disclosure is configured and arranged to selectively deposit material comprising molybdenum on a first surface of a substrate relative to a second surface of the substrate.

In the illustrated example, processing assembly 300 includes one or more reaction chambers 302, a first precursor source 304, reactant source 306, a second precursor source 308, an exhaust source 310, and a controller 312. The processing assembly 300 may comprise one or more additional gas sources (not shown), such as an inert gas source, a carrier gas source, additional reactant source(s) and/or a purge gas source.

Reaction chamber 302 can include any suitable reaction chamber, such as an ALD or CVD reaction chamber as described herein. The reaction chamber is constructed and arranged to hold the substrate according to the current disclosure.

The first precursor source 304 can include a vessel and a molybdenum halide precursor as described herein—alone or mixed with one or more carrier (e.g., inert) gases. The first precursor source 304 is constructed and arranged to contain and evaporate molybdenum halide precursor. A reactant source 306 can include a vessel and a reactant as described herein—alone or mixed with one or more carrier gases. The reactant source 306 is constructed an arranged to contain and evaporate a reactant according to the current disclosure. The second precursor source 308 can include a vessel and a molybdenum oxyhalide precursor as described herein—alone or mixed with one or more carrier (e.g., inert) gases. The second precursor source 308 is constructed and arranged to contain and evaporate molybdenum oxyhalide precursor. Although illustrated with three sources 304, 306, 308, vapor deposition assembly 300 can include any suitable number of sources. Sources 304, 306 and 308 can be coupled to reaction chamber 302 via lines 314, 316 and 318, which can each include flow controllers, valves, heaters, and the like. In some embodiments, the molybdenum halide precursor in the first precursor source 304, the reactant in the reactant source 306, the molybdenum oxyhalide precursor in the second precursor source 308 and/or an additional reactant in an optional additional reactant vessel (not shown) may be heated. In some embodiments, a precursor vessel is heated. Each vessel may be heated to a different temperature, according to the precursor or reactant properties, such as thermal stability and volatility.

Exhaust source 310 can include one or more vacuum pumps.

Controller 312 includes electronic circuitry and software to selectively operate valves, manifolds, heaters, pumps and other components included in the processing assembly 300. Such circuitry and components operate to introduce precursors, reactants and purge gases from the respective sources. Controller 312 can control timing of gas pulse sequences, temperature of the substrate and/or reaction chamber 302, pressure within the reaction chamber 302, and various other operations to provide proper operation of the processing assembly 300. Controller 312 can include control software to electrically or pneumatically control valves to control flow of precursors, reactants and additional gases into and out of the reaction chamber 302. Controller 312 can include modules such as a software or hardware component, which performs certain tasks. A module may be configured to reside on the addressable storage medium of the control system and be configured to execute one or more processes.

Thus, the vapor deposition assembly 300 is constructed and arranged to provide molybdenum halide precursor, molybdenum oxyhalide precursor and a reactant into the reaction chamber in a vapor phase to deposit material comprising molybdenum selectively on the first surface of the substrate relative to the second surface of the substrate Other configurations of vapor deposition assembly 300 are possible, including different numbers and kinds of precursor and reactant sources. Further, it will be appreciated that there are many arrangements of valves, conduits, precursor sources, and additional reactant sources that may be used to accomplish the goal of selectively and in coordinated manner feeding gases into reaction chamber 302. Further, as a schematic representation of a vapor deposition assembly, many components have been omitted for simplicity of illustration, and such components may include, for example, various valves, manifolds, purifiers, heaters, containers, vents, and/or bypasses.

During operation of vapor deposition assembly 300, substrates, such as semiconductor wafers (not illustrated), are transferred from, e.g., a substrate handling system to reaction chamber 302. Once substrate(s) are transferred to reaction chamber 302, one or more gases from gas sources, such as precursors, reactants, carrier gases, and/or purge gases, are introduced into reaction chamber 302.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of selectively depositing material comprising molybdenum on a first surface of a substrate relative to a second surface of the substrate by a cyclic deposition process, the method comprising:

providing a substrate having a first surface and a second surface in a reaction chamber, wherein the first surface comprises a different material from the second surface; and performing at least one super-cycle comprising a halide sub-cycle and an oxyhalide sub-cycle, wherein the halide sub-cycle comprises:

providing molybdenum halide precursor into the reaction chamber in a vapor phase;

wherein the oxyhalide sub-cycle comprises:

providing molybdenum oxyhalide precursor into the reaction chamber in a vapor phase and providing a reactant into the reaction chamber;

and wherein the at least one super-cycle is repeated such that the halide sub-cycle and oxyhalide sub-cycle alternate multiple times to selectively deposit the material comprising molybdenum on the first surface relative to the second surface of the substrate.

2. The method of claim 1, wherein a halogen in the molybdenum halide precursor and molybdenum oxyhalide precursor is selected from the group consisting of chlorine, fluorine, bromine and iodine.

3. The method of claim 1, wherein the molybdenum oxyhalide precursor is selected from the group consisting of $MoO_2Cl_2$ and $MoClO_4$, and wherein the molybdenum halide precursor is $MoCl_5$.

4. The method of claim 1, wherein the reactant is a reducing agent.

5. The method of claim 1, wherein the reactant is selected from the group consisting of hydrazine and derivatives of hydrazine.

6. The method of claim 1, wherein the halide sub-cycle further comprises providing a reactant into the reaction chamber in a vapor phase, and wherein the molybdenum halide precursor and the reactant of the halide sub-cycle are provided into the reaction chamber alternately and sequentially.

7. The method of claim 1, wherein the molybdenum oxyhalide precursor and the reactant are provided into the reaction chamber alternately and sequentially.

8. The method of claim 1, wherein a ratio of halide sub-cycles to oxyhalide sub-cycles in at least one super-cycle is from 1:1 to 1:50.

9. The method of claim 1, wherein at least one super-cycle comprises from 1 to 50 oxyhalide sub-cycles.

10. The method of claim 9, wherein the at least one super-cycle is performed from 2 to 1,500 times.

11. The method of claim 1, wherein the first surface is a metal or metallic surface.

12. The method of claim 11, wherein the metal or metallic surface is selected from the group consisting of elemental molybdenum surface, elemental tungsten surface, elemental ruthenium surface, elemental copper surface, elemental cobalt surface, vanadium nitride surface, titanium carbide surface, and titanium nitride surface.

13. The method of claim 1, wherein the second surface is a dielectric surface.

14. The method of claim 13, wherein the dielectric surface comprises silicon.

15. The method of claim 13, wherein the second surface is a metal oxide surface.

16. The method according to claim 1, wherein the at least one super-cycle is repeated multiple times such that the material comprising molybdenum is selectively deposited on the first surface of the substrate relative to the second surface of the substrate with a selectivity of greater than 80%.

17. The method according to claim 1, wherein, in the method, at least one halide sub-cycle is provided after 2 to 20 oxyhalide sub-cycles.

18. The method according to claim 17, wherein the at least one halide sub-cycle is provided after 2 to 20 oxyhalide sub-cycles at least twice in the method.

19. The method of claim 1, wherein the first surface comprises copper and the second surface comprises silicon oxycarbide (SiOC).

20. A vapor deposition assembly for selectively depositing material comprising molybdenum on a first surface of a substrate relative to a second surface of the substrate, the vapor deposition assembly comprising:

one or more reaction chambers constructed and arranged to hold the substrate having the first surface and the second surface, wherein the first surface comprises a different material from the second surface;

a first precursor source constructed and arranged to contain and evaporate molybdenum halide precursor;

a second precursor source constructed and arranged to contain and evaporate molybdenum oxyhalide precursor;

a reactant source constructed and arranged to contain and evaporate a reactant; and a controller operatively connected to the first precursor source, the second precursor source, the reactant source, and the one or more reaction chambers, wherein the controller is configured to coordinate the operation of the assembly to perform the method according to claim 1.

* * * * *